US008632224B2

(12) United States Patent
Kaseya

(10) Patent No.: US 8,632,224 B2
(45) Date of Patent: Jan. 21, 2014

(54) LIGHT EMITTING DEVICE AND PROJECTOR

(75) Inventor: Hiroyasu Kaseya, Suwa (JP)

(73) Assignee: Seiko Epson Corporation (JP)

( * ) Notice: Subject to any disclaimer, the term of this patent is extended or adjusted under 35 U.S.C. 154(b) by 445 days.

(21) Appl. No.: 12/961,855

(22) Filed: Dec. 7, 2010

(65) Prior Publication Data

US 2011/0134396 A1 Jun. 9, 2011

(30) Foreign Application Priority Data

Dec. 9, 2009 (JP) .................................. 2009-279197

(51) Int. Cl.
*F21S 4/00* (2006.01)

(52) U.S. Cl.
USPC ...... 362/297; 362/296.08; 362/299; 362/300; 362/241; 353/82; 353/37; 353/98; 353/99

(58) Field of Classification Search
USPC ........... 362/297, 217.05, 217, 6, 241, 296.08, 362/311.02, 299, 300, 225; 353/82, 37, 98, 353/99
See application file for complete search history.

(56) References Cited

U.S. PATENT DOCUMENTS

| 5,276,592 | A  | * | 1/1994  | Henkes        | 362/517 |
|-----------|----|---|---------|---------------|---------|
| 6,834,963 | B2 | * | 12/2004 | Kim et al.    | 353/31  |
| 7,431,486 | B2 | * | 10/2008 | Bloemen et al.| 362/540 |
| 7,441,923 | B2 | * | 10/2008 | Hunerbein et al.| 362/241 |

FOREIGN PATENT DOCUMENTS

| JP | 2001-215443 |   | 8/2001 |          |
|----|-------------|---|--------|----------|
| WO | WO 91/06078 | * | 5/1991 | G08B 5/00|

* cited by examiner

*Primary Examiner* — Sharon Payne
(74) *Attorney, Agent, or Firm* — Harness, Dickey & Pierce, P.L.C.

(57) ABSTRACT

A light emitting device includes: a first light emission element which emits a first light; a second light emission element which emits a second light; a first reflection surface which reflects the first light; and a second reflection surface which reflects the second light, wherein the first light emission element and the second light emission element are laminated in a first direction and disposed in such positions that the emission direction of the first light and the emission direction of the second light become parallel with each other and that the first light emission element and the second light emission element do not overlap with each other as viewed in the first direction, and the traveling direction of the first light reflected by the first reflection surface and the traveling direction of the second light reflected by the second reflection surface become parallel with each other.

7 Claims, 7 Drawing Sheets

LIGHT EMITTING DEVICE AND PROJECTOR

BACKGROUND

1. Technical Field

The present invention relates to a light emitting device and a projector.

2. Related Art

Recently, a light emitting device including a high-luminance laser element having excellent color reproducibility has been expected as a light source of a display apparatus such as a projector and a display. According to this type of light emitting device used as the light source, higher output has been demanded for display of bright images. As a method of increasing the output, JP-A-2001-215443 proposes a light emitting device which stacks laminations of light emission elements constituted by semiconductor laser arrays, for example. According to the light emitting device disclosed in JP-A-2001-215443, emission lights emitted from the laminations of the stacked light emission elements are reflected by reflection units having light reflection surfaces whose positions are steppedly shifted from one another, and are supplied to converging lenses.

According to the structure shown in JP-A-2001-215443, however, the size of the device increases in the traveling directions of the emission lights due to the positions of the light reflection surfaces steppedly shifted in the traveling directions of the emission lights.

SUMMARY

An advantage of some aspects of the invention is to provide a light emitting device which is compact and capable of producing high output. Another advantage of some aspects of the invention is to provide a projector including this light emitting device.

A light emitting device according to a first aspect of the invention includes: a first light emission element which has a first emission surface for emitting a first emission light, and a second emission surface for emitting a second emission light traveling in a direction opposite to the direction of the first emission light; a second light emission element which has a third emission surface for emitting a third emission light traveling in the same direction as the direction of the first emission light, and a fourth emission surface for emitting a fourth emission light traveling in the direction opposite to the direction of the third emission light; a first reflection surface which reflects the first emission light emitted from the first light emission element; a second reflection surface which reflects the second emission light emitted from the first light emission element; a third reflection surface which reflects the third emission light emitted from the second light emission element; and a fourth reflection surface which reflects the fourth emission light emitted from the second light emission element. The first light emission element and the second light emission element are laminated in a first direction. The first emission surface and the third emission surface are located within a first plane. The second emission surface and the fourth emission surface are located within a second plane. The first emission surface and the third emission surface are disposed in such positions as to be shifted from each other in the first direction in the first plane. The second emission surface and the fourth emission surface are disposed in such positions as to be shifted from each other in the first direction in the second plane. The first reflection surface and the third reflection surface are disposed in such positions that the optical path length of the first emission light between the first emission surface and the first reflection surface becomes equal to the optical path length of the third emission light between the third emission surface and the third reflection surface. The second reflection surface and the fourth reflection surface are disposed in such positions that the optical path length of the second emission light between the second emission surface and the second reflection surface becomes equal to the optical path length of the fourth emission light between the fourth emission surface and the fourth reflection surface. The traveling direction of the first emission light reflected by the first reflection surface, the traveling direction of the second emission light reflected by the second reflection surface, the traveling direction of the third emission light reflected by the third reflection surface, and the traveling direction of the fourth emission light reflected by the fourth reflection surface are equalized.

According to this light emitting device, the first reflection surface and the third reflection surface can be disposed such that the optical path length of the first emission light between the first emission surface and the first reflection surface becomes equal to the optical path length of the third emission light between the third emission surface and the third reflection surface. In addition, the second reflection surface and the fourth reflection surface can be disposed such that the optical path length of the second emission light between the second emission surface and the second reflection surface becomes equal to the optical path length of the fourth emission light between the fourth emission surface and the fourth reflection surface. Thus, the output of the light emitting device can be raised without increasing the size of the device in the traveling directions of the first through fourth emission lights. Accordingly, the light emitting device becomes a high-output and compact light emitting device.

The light emitting device according to the first aspect of the invention may further include: a first collimating lens disposed on the optical path of the first emission light between the first emission surface and the first reflection surface to convert the first emission light into collimated light; a second collimating lens disposed on the optical path of the second emission light between the second emission surface and the second reflection surface to convert the second emission light into collimated light; a third collimating lens disposed on the optical path of the third emission light between the third emission surface and the third reflection surface to convert the third emission light into collimated light; and a fourth collimating lens disposed on the optical path of the fourth emission light between the fourth emission surface and the fourth reflection surface to convert the fourth emission light into collimated light.

According to this light emitting device, the first through fourth emission lights can be converted into collimated lights and supplied to the first through fourth reflection surfaces by using the first through fourth collimating lenses. Thus, the efficiency of using light can increase.

The light emitting device according to the first aspect of the invention may satisfy the following point: the first reflection surface, the second reflection surface, the third reflection surface, and the fourth reflection surface are parabolic mirrors.

According to this light emitting device, the first through fourth emission lights can be converted into collimated lights by using the first through fourth reflection surfaces. Thus, the efficiency of using light can increase.

The light emitting device of the first aspect of the invention may satisfy the following points: the plural first emission surfaces are disposed at equal intervals; the plural second emission surfaces are disposed at equal intervals; the plural third emission surfaces are disposed at equal intervals; and the plural fourth emission surfaces are disposed at equal intervals.

According to this light emitting device, heat generated by light emission does not concentrate on a part of the light emission elements.

The light emitting device according to the first aspect of the invention may satisfy the following point: the first light emission element and the second light emission element are super luminescent diodes.

According to this light emitting device, formation of a resonator produced by end surface reflection can be reduced, and thus laser generation can be prevented. Accordingly, speckle noise can be decreased.

A projector according to a second aspect of the invention includes: the light emitting device according to the first aspect of the invention; a light modulation device which modulates light emitted from the light emitting device according to image information; and a projection device which projects an image formed by the light modulation device.

This projector includes the light emitting device of the first aspect of the invention as a light source. Thus, the projector becomes a high-output and compact projector.

BRIEF DESCRIPTION OF THE DRAWINGS

The invention will be described with reference to the accompanying drawings, wherein like numbers reference like elements.

DESCRIPTION OF EXEMPLARY EMBODIMENT

A preferred embodiment according to the invention is hereinafter described with reference to the drawings.

1. Light Emitting Device

Figure 1:
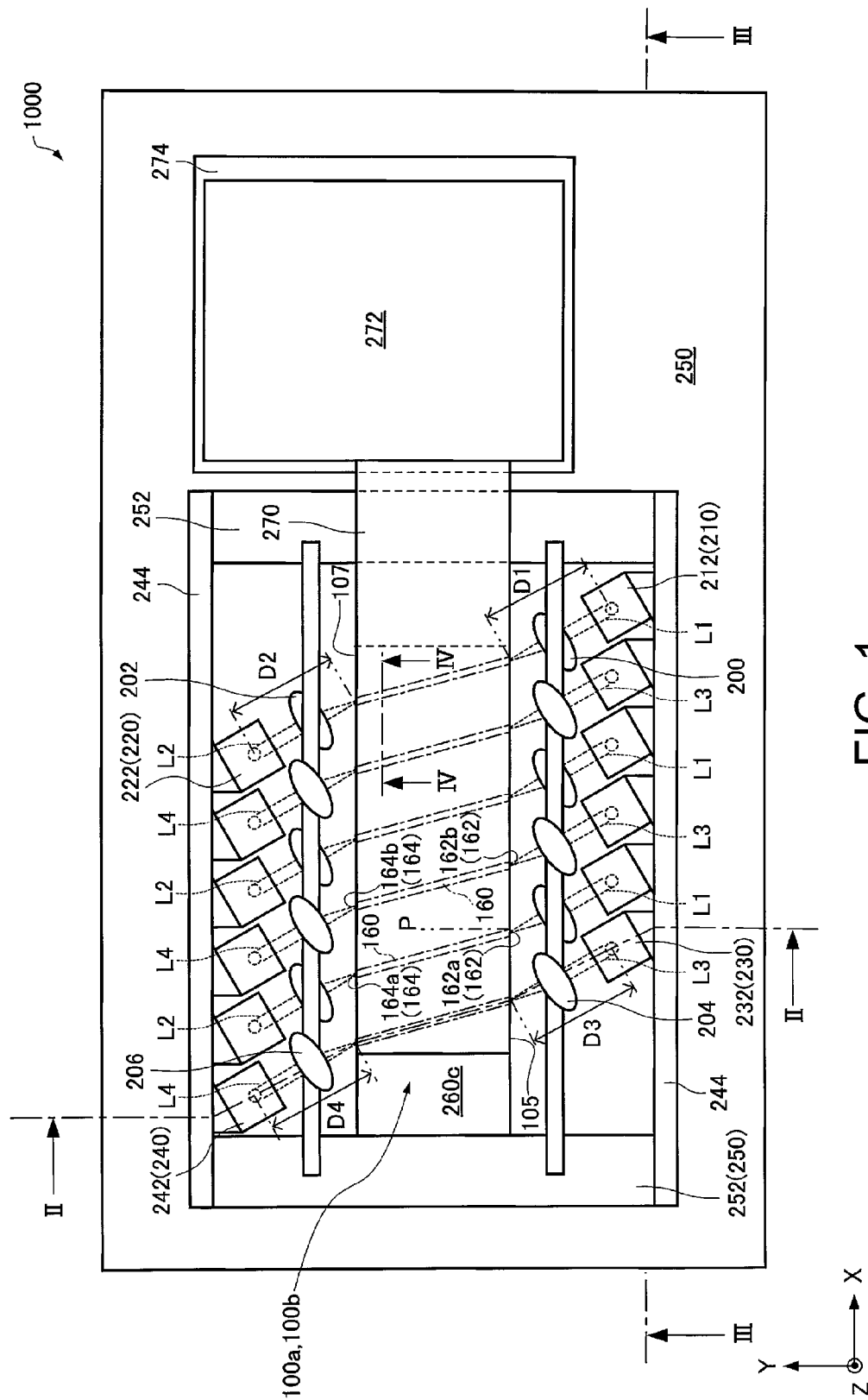
FIG. 1 is a plan view schematically illustrating a light emitting device according to an embodiment.
Figure 2:
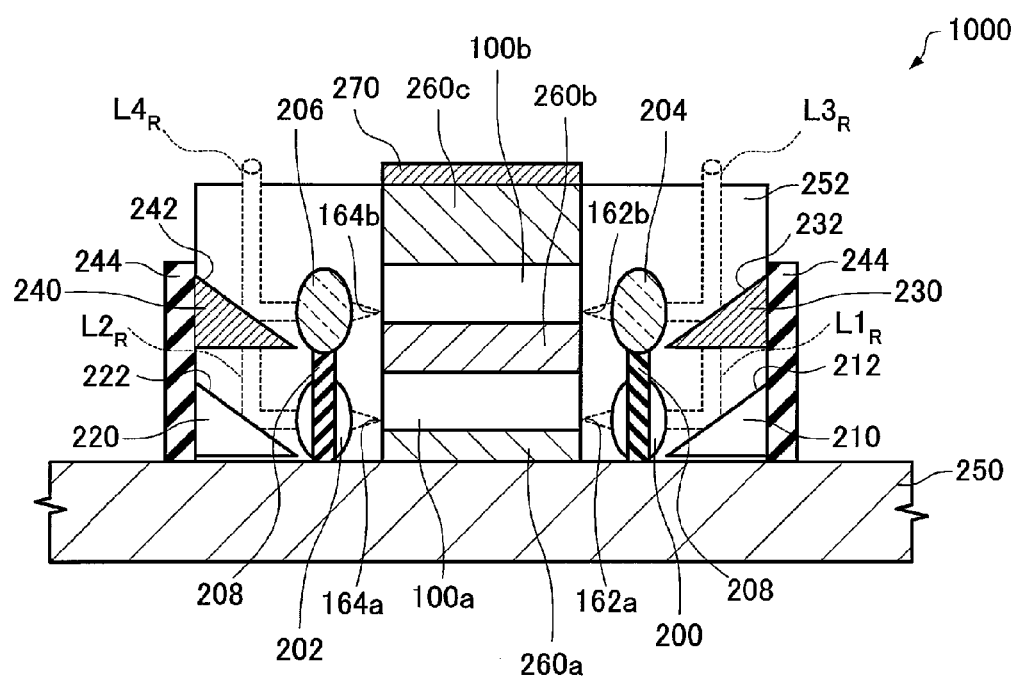
FIG. 2 is a cross-sectional view schematically illustrating the light emitting device according to the embodiment.
Figure 3:
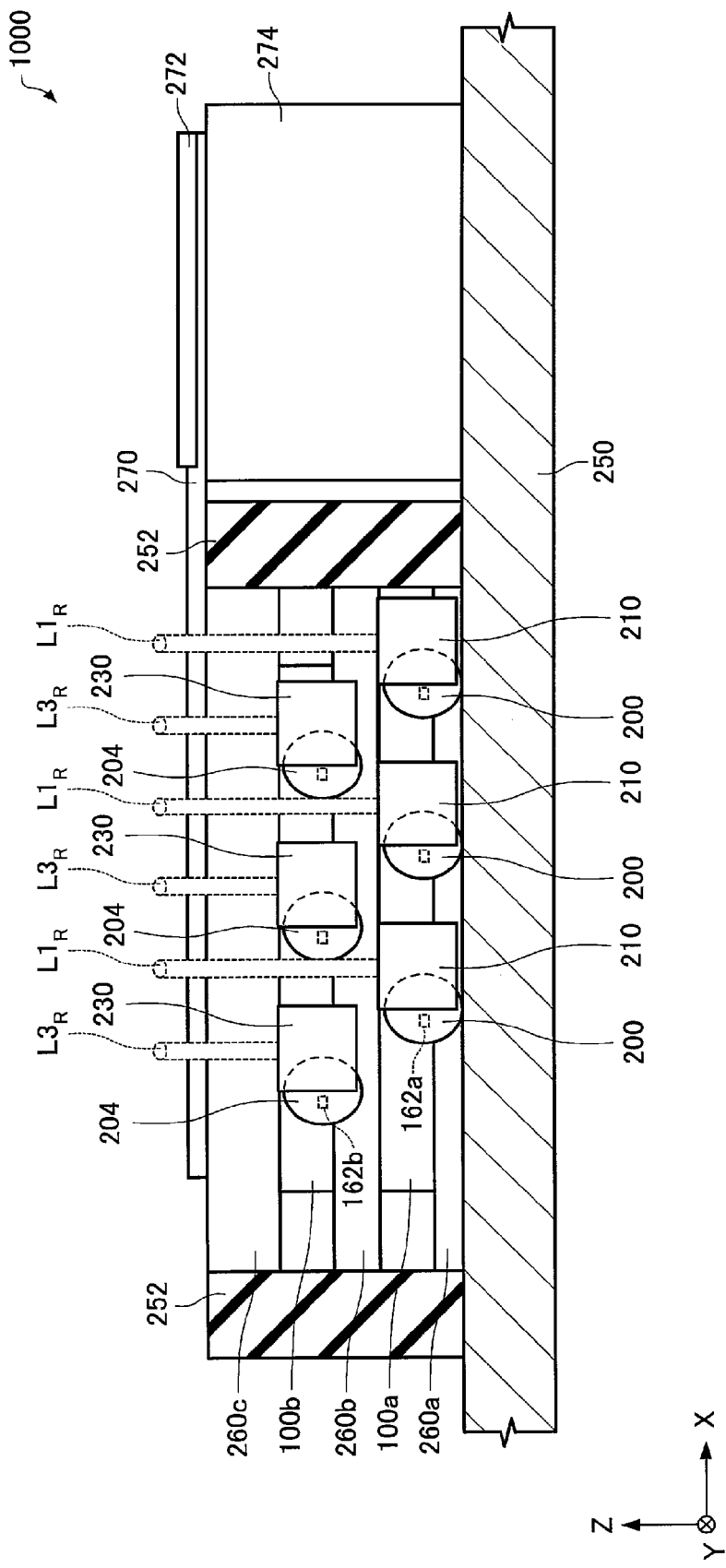
FIG. 3 is a cross-sectional view schematically illustrating the light emitting device according to the embodiment.
Figure 4:
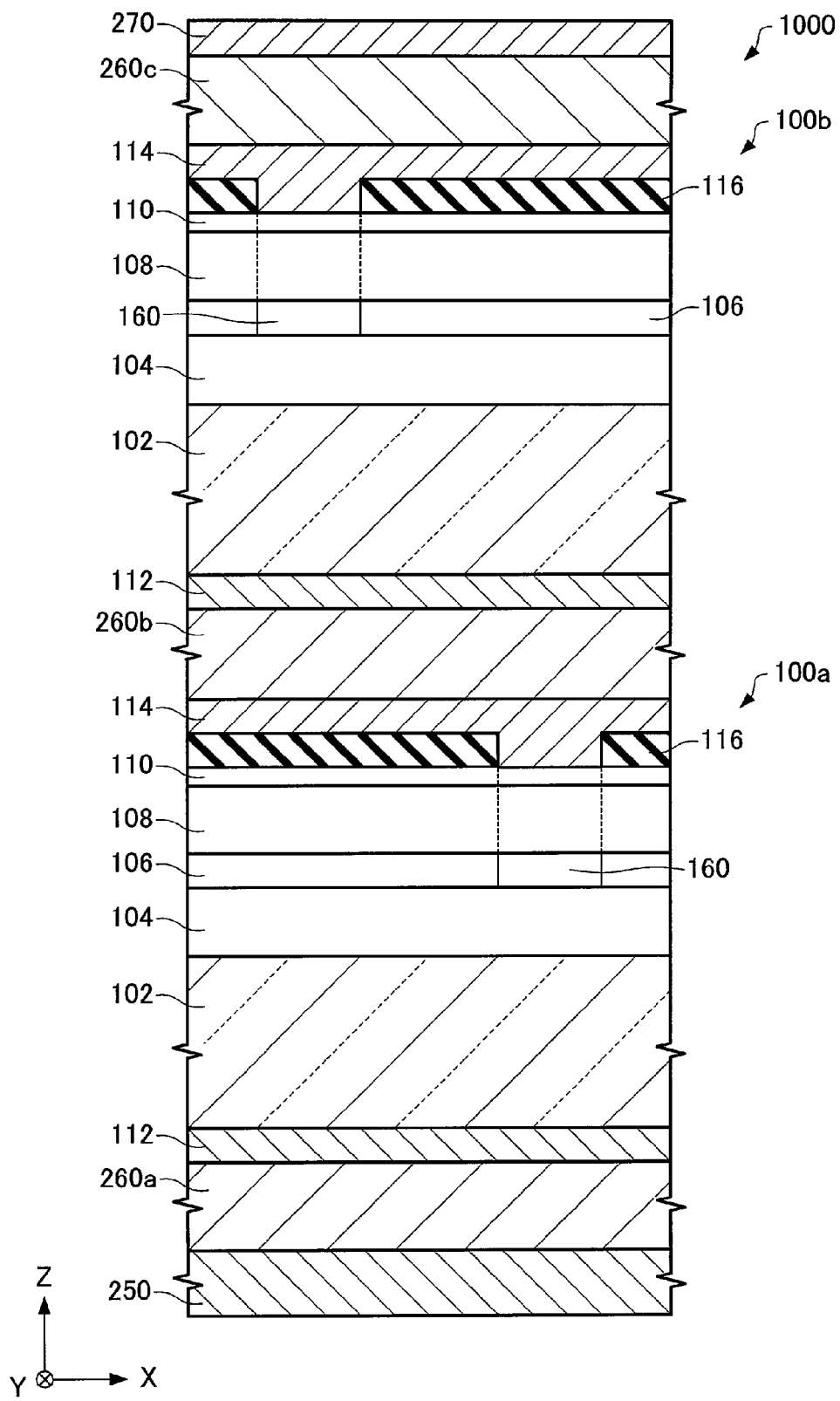
FIG. 4 is a cross-sectional view schematically illustrating the light emitting device according to the embodiment.

A light emitting device 1000 according to this embodiment is initially described with reference to the drawings. FIG. 1 is a plan view schematically illustrating the light emitting device 1000. FIG. 2 is a cross-sectional view schematically illustrating the light emitting device 1000 taken along a line II-II in FIG. 1. FIG. 3 is a cross-sectional view schematically illustrating the light emitting device 1000 taken along a line III-III in FIG. 1. FIG. 4 is a cross-sectional view schemati-cally illustrating the light emitting device 1000 taken along a line IV-IV in FIG. 1. In FIGS. 2 and 3, simplified light emission elements 100 are shown for convenience.

As illustrated in FIGS. 1 through 4, the light emitting device 1000 includes a first light emission element 100a, a second light emission element 100b, first reflection units 210 each of which has a first reflection surface 212, second reflection units 220 each of which has a second reflection surface 222, third reflection units 230 each of which has a third reflection surface 232, and fourth reflection units 240 each of which has a fourth reflection surface 242. The light emitting device 1000 may further include first collimating lenses 200, second collimating lenses 202, third collimating lenses 204, fourth collimating lenses 206, a base 250, a first sub mount 260a, a second sub mount 260b, and a third sub mount 260c. In this embodiment, the case in which the light emission elements 100a and 100b are constituted by super luminescent diodes (hereinafter referred to as "SLD" as well) of InGaAlP system (red) will be discussed. Unlike a semiconductor laser, the SLD reduces formation of a resonator produced by end surface reflection, thereby preventing laser generation. Thus, speckle noise can decrease.

As illustrated in FIGS. 2 through 4, the first light emission element 100a and the second light emission element 100b are laminated in the Z direction (first direction). According to the example shown in the figures, the first sub mount 260a, the first light emission element 100a, the second sub mount 260b, the second light emission element 100b, and the third sub mount 260c are laminated on the base 250 in this order. The first light emission element 100a and the second light emission element 100b are mounted on the base 250 with the sub mounts 260a, 260b, and 260c provided between the first and second light emission elements 100a and 100b and the base 250. For example, voltage can be applied to the light emission elements 100a and 100b via the conductive sub mounts 260a, 260b, and 260c by giving different potentials to the base 250 and a lead 270. Though not shown in the figures, the base 250 may be electrically connected with the light emission elements 100a and 100b by a through electrode provided on the sub mounts 260a, 260b, and 260c, for example. While the light emitting device 1000 contains the two light emission elements (the first light emission element 100a and the second light emission element 100b) in the example shown in the figures, the number of the light emission elements is not particularly limited. The light emitting device 1000 can produce high output by including the plural (two) light emission elements 100a and 100b. The light emitting device 1000 may further increase the output by containing one or plural light emission elements in addition to the first light emission element 100a and the second light emission element 100b, for example. In this case, the output of the light emitting device can be further raised. As illustrated in FIG. 4, each of the first light emission element 100a and the second light emission element 100b has a first clad layer 104, an active layer 106, and a second clad layer 108. Each of the first light emission element 100a and the second light emission element 100b may further have a substrate 102, a contact layer 110, a first electrode 112, a second electrode 114, and an insulation portion 116.

The substrate 102 is constituted by a first conductive type (such as n-type) GaAs substrate, for example.

The first clad layer 104 is formed on the substrate 102. The first clad layer 104 is constituted by an n-type AlGaInP layer, for example. Though not shown in the figures, a buffer layer may be provided between the substrate 102 and the first clad layer 104. The buffer layer is constituted by an n-type GaAs layer or an InGaP layer, for example.

The active layer 106 is formed on the first clad layer 104. The active layer 106 is sandwiched between the first clad layer 104 and the second clad layer 108. The active layer 106 has a multi-quantum well (MQW) structure which overlaps three quantum well constitutions each having an InGaP well layer and an InGaAlP barrier layer, for example.

The active layer 106 has a rectangular parallelepiped shape (including a cubic shape), for example. As illustrated in FIG. 1, the active layer 106 has a first side surface 105 and a second side surface 107. The first side surface 105 and the second side surface 107 disposed opposed to each other extend in parallel with each other, for example. The active layer 106 sandwiched between the first clad layer 104 and the second clad layer 108 constitutes a laminated structure body, for example. The first side surface 105 and the second side surface 107 are surfaces of the active layer 106 not contacting the first clad layer 104 or the second clad layer 108, and thus considered as exposed surfaces of the laminated structure body. The laminated structure body may further contain the substrate 102 and the contact layer 110.

A part of the area of the active layer 106 constitutes a gain area 160 which corresponds to a current path of the active layer 106. Light can be generated in the gain area 160, where gains are given to this generated light. The plane shape of the gain area 160 is a parallelogrammatic shape, for example. As illustrated in FIG. 1, the gain area 160 extends from the first side surface 105 to the second side surface 107 with inclination to a perpendicular line P of the first side surface 105 in the plan view as viewed in the lamination direction of the active layer 106 (as viewed in the Z direction). In this arrangement, laser generation of the light produced within the gain area 160 can be reduced or prevented. The condition in which the gain area 160 is provided in a certain direction refers to the condition in which this direction agrees with the direction connecting the center of a first end surface 162 of the gain area 160 on the first side surface 105 side and the center of a second end surface 164 of the gain area 160 on the second side surface 107 side in the plan view. While the three gain areas 160 are provided on each of the first light emission element 100a and the second light emission element 100b in the example shown in the figures, the number of the gain areas 160 is not specifically limited. The light emission elements 100a and 100b can produce high output by including the plural gain areas 160.

Though not shown in the figures, each of the gain areas 160 may linearly extend from the first end surface 162 on the first side surface 105 side to the second end surface 164 on the second side surface 107 side in a direction parallel with the perpendicular line P of the first side surface 105. In this case, the resonator is formed, and thus laser beams can be generated. That is, the first light emission element 100a and the second light emission element 100b may be semiconductor lasers, for example.

As illustrated in FIG. 4, the second clad layer 108 is formed on the active layer 106. The second clad layer 108 is constituted by a second conductive type (such as p-type) AlGaInP layer, for example.

The p-type second clad layer 108, the active layer 106 containing not-doped impurities, and the n-type first clad layer 104 constitute a pin diode, for example. Each of the first clad layer 104 and the second clad layer 108 has a larger forbidden band width and a smaller refractive index than those of the active layer 106. The active layer 106 has a function of amplifying light. The first clad layer 104 and the second clad layer 108 between which the active layer 106 is sandwiched have a function of closing injection carriers (electrons and holes) and light.

The contact layer 110 is disposed on the second clad layer 108. The contact layer 110 may be a layer capable of providing ohmic contact with the second electrode 114. The contact layer 110 is made of a second conductive type semiconductor, for example. Thus, the contact layer 110 may be constituted by a p-type GaAs layer, for example.

The insulation portion 116 is disposed on the area of the contact layer 110 other than the area above the gain area 160. That is, the insulation portion 116 has an opening above the gain area 160 such that the surface of the contact layer 110 can be exposed through the opening. The insulation portion 116 is made of an SiN layer, an $SiO_2$ layer, a polyimide layer, for example.

The first electrode 112 is provided on the entire area of the lower surface of the substrate 102. The first electrode 112 may contact the layer (the substrate 102 in the example shown in the figures) which provides ohmic contact with the first electrode 112. The first electrode 112 is electrically connected with the first clad layer 104 via the substrate 102. The first electrode 112 is one of electrodes for driving the light emission elements 100a and 100b. The first electrode 112 is produced by laminating a Cr layer, an AuGe layer, an Ni layer, and an Au layer in this order from the substrate 102 side, for example. A second contact layer (not shown) may be provided between the first clad layer 104 and the substrate 102. In this case, the second contact layer on the first clad layer 104 side is exposed by dry-etching or other method, and the first electrode 112 is formed on the second contact layer. By this method, a single-sided electrode structure can be produced. The second contact layer is constituted by an n-type GaAs layer, for example.

The second electrode 114 is formed on the exposed contact layer 110 and the insulation portion 116. The second electrode 114 is electrically connected with the second clad layer 108 via the contact layer 110. The second electrode 114 is one of electrodes for driving the light emission elements 100a and 100b. The second electrode 114 is produced by laminating a Cr layer, an AuZn layer, and an Au layer in this order from the contact layer 110 side, for example. The contact surfaces of the second electrode 114 and the contact layer 110 contacting each other have the same plane surface as that of the gain area 160, for example. In the example shown in the figures, the plane shape of the contact surfaces of the second electrode 114 and the contact layer 110 can determine the current path between the electrodes 112 and 114, and thus can determine the plane shape of the gain area 160.

According to the light emission elements 100a and 100b, electrons and holes are re-combined in the gain area 160 of the active layer 106 when forward bias voltage is applied between the first electrode 112 and the second electrode 114 from the pin diode. This re-combination causes light emission. As a result, induced emission occurs from the start point of the generated light as a chain reaction, and thus light travels through the gain area 160. While the light is passing therethrough, the intensity of the light is amplified. Then, emission lights L1 and L3 can be released through the first end surfaces 162, and emission lights L2 and L4 can be released through the second end surfaces 164. More specifically, the first light emission element 100a can emit the first emission lights L1 from the first end surfaces 162 (first emission surfaces 162a), and can emit the second emission lights L2 from the second end surfaces 164 (second emission surfaces 164a). Similarly, the second light emission element 100b can emit the third emission lights L3 from the first end surfaces 162 (third emission surfaces 162b), and can emit the fourth emission lights L4 from the second end surfaces 164 (fourth emission surfaces 164b). The emission lights L1, L2, L3, and L4 can be supplied with larger inclinations than those of the gain areas 160 with respect to the perpendicular line P of the first side surface 105 by the refractions of the lights, for example. The first emission lights L1 and the second emission lights L2 can travel in directions parallel with the upper surface of the active layer 106, for example. The traveling directions of the first emission lights L1 and the traveling directions of the second emission lights L2 are opposite to each other. Similarly, the third emission lights L3 and the fourth emission lights L4 can travel in directions parallel with the upper surface of the active layer 106, for example. The traveling directions of the third emission lights L3 and the traveling directions of the fourth emission lights L4 are opposite to each other. The traveling directions of the first emission lights L1 are the same as the traveling directions of the third emission lights L3, for example. Also, the traveling directions of the second emission lights L2 are the same as the traveling directions of the fourth emission lights L4, for example.

As illustrated in FIGS. 1 through 3, the first emission surfaces 162a of the first light emission element 100a and the third emission surfaces 162b of the second light emission element 100b are positioned within the same plane (a first plane: X-Z plane in the example shown in the figures). Similarly, the second emission surfaces 164a of the first light emission element 100a and the fourth emission surfaces 164b of the second light emission element 100b are positioned within the same plane (a second plane: X-Z plane in the example shown in the figures). The first plane and the second plane are planes opposed to each other, for example, and positioned in parallel with each other in the example shown in the figures. As illustrated in FIG. 3, each of the first emission surfaces 162a and the corresponding third emission surface 162b are disposed in such positions as to be shifted from one another in the direction where the light emission elements 100a and 100b are laminated (the Z direction) on the first plane. That is, the center of the first emission surface 162a and the center of the third emission surfaces 162b are not positioned on the same line extending in the direction where the light emission elements 100a and 100b are laminated. The center of the first emission surface 162a herein refers to the position where the light intensity becomes the highest on the first emission surface 162a. This applies to the other emission surfaces. The first emission surface 162a and the third emission surface 162b may be disposed in such positions as not to overlap with each other as viewed in the direction where the light emission elements 100a and 100b are laminated. Similarly, each of the second emission surfaces 164a and the corresponding fourth emission surface 164b are disposed in such positions as to be shifted from one another in the direction where the light emission elements 100a and 100b are laminated (the Z direction) on the second plane. That is, the center of the second emission surface 164a and the center of the fourth emission surface 164b are not positioned on the same line extending in the direction where the light emission elements 100a and 100b are laminated. The second emission surface 164a and the fourth emission surface 164b may be disposed in such positions as not to overlap with each other as viewed in the direction where the light emission elements 100a and 100b are laminated.

The plural first emission surfaces 162a may be disposed at equal intervals on the first side surface 105 of the active layer 106 of the first light emission element 100a. The plural second emission surfaces 164a may be disposed at equal intervals on the second side surface 107 of the active layer 106 of the first light emission element 100a. Thus, the gain areas 160 may be disposed at equal intervals on the active layer 106. In this structure, heat generated by light emission does not concentrate on a part of the first light emission element 100a. The plural third emission surfaces 162b may be disposed at equal intervals on the first side surface 105 of the active layer 106 of the second light emission element 100b. The plural fourth emission surfaces 164b may be disposed at equal intervals on the second side surface 107 of the active layer 106 of the second light emission element 100b. Thus, the gain areas 160 may be disposed at equal intervals on the active layer 106. In this structure, heat generated by light emission does not concentrate on a part of the second light emission element 100b.

As illustrated in FIGS. 1 and 2, the first collimating lenses 200 are disposed on the optical paths of the first emission lights L1 between the first emission surfaces 162a and the first reflection surfaces 212. Each of the first collimating lenses 200 is supported by a lens supporting unit 208, for example. The first collimating lenses 200 are optical elements for converting the first emission lights L1 into collimated lights. Thus, the first emission lights L1 are converted into collimated lights and supplied to the first reflection surfaces 212 by using the first collimating lenses 200. Thus, the efficiency of using light can increase.

The second collimating lenses 202 are disposed on the optical paths of the second emission lights L2 between the second emission surfaces 164a and the second reflection surfaces 222. Each of the second collimating lenses 202 is supported by the lens supporting unit 208, for example. The second collimating lenses 202 are optical elements for converting the second emission lights L2 into collimated lights. Thus, the second emission lights L2 are converted into collimated lights and supplied to the second reflection surfaces 222 by using the second collimating lenses 202. Thus, the efficiency of using light can increase.

The third collimating lenses 204 are disposed on the optical paths of the third emission lights L3 between the third emission surfaces 162b and the third reflection surfaces 232. Each of the third collimating lenses 204 is supported by the lens supporting unit 208, for example. The third collimating lenses 204 are optical elements for converting the third emission lights L3 into collimated lights. Thus, the third emission lights L3 are converted into collimated lights and supplied to the third reflection surfaces 232 by using the third collimating lenses 204. Thus, the efficiency of using light can increase.

The fourth collimating lenses 206 are disposed on the optical paths of the fourth emission lights L4 between the fourth emission surfaces 164b and the fourth reflection surfaces 242. Each of the fourth collimating lenses 206 is supported by the lens supporting unit 208, for example. The fourth collimating lenses 206 are optical elements for converting the fourth emission lights L4 into collimated lights. Thus, the fourth emission lights L4 are converted into collimated lights and supplied to the fourth reflection surfaces 242 by using the fourth collimating lenses 206. Thus, the efficiency of using light can increase.

The lens supporting units 208 are components for supporting the collimating lenses 200, 202, 204, and 206. In the example shown in the figures, the two lens supporting units 208 are equipped, one of which supports the first collimating lenses 200 and the third collimating lenses 204, and the other of which supports the second collimating lenses 202 and the fourth collimating lenses 206. The shapes of the lens supporting units 208 are not specifically limited as long as they can support the collimating lenses 200, 202, 204, and 206. The lens supporting units 208 are made of glass, ceramics or the like.

The first reflection units 210 can reflect the first emission lights L1 by the first reflection surfaces 212. The first emission lights L1 converted into collimated lights by the first collimating lenses 200 are reflected by the first reflection surfaces 212. The first reflection surfaces 212 can be considered as surfaces of the first reflection units 210 for receiving the first emission lights L1. The first reflection surfaces 212 can reflect the first emission lights L1 toward above the light emission elements 100a and 100b. The first emission lights L1 reflected by the first reflection surfaces 212 can travel upward in the vertical direction with respect to the upper surface of the active layer 106 (Z direction) as first reflection lights $L1_R$, for example. The first reflection surfaces 212 are inclined to the upper surface of the base 250 (X-Y plane), for example, and are inclined at 45 degrees in the example shown in the figures. In this arrangement, right angles are formed by each traveling direction of the first emission lights L1 and the corresponding traveling direction of the first reflection light $L1_R$. It is preferable that the reflectance of the first reflection surfaces 212 for reflecting the first emission lights L1 is higher than 50% and equal to or lower than 100%. The first reflection units 210 are made of Al, Ag, or Au, for example. The first reflection surfaces 212 of the first reflection units 210 may be produced by using these materials (such as Al, Ag, and Au) only for the material of the surfaces of the first reflection units 210, for example. The first reflection units 210 are supported by a reflection unit supporting substrate 244, for example.

The second reflection units 220 can reflect the second emission lights L2 by the second reflection surfaces 222. The second emission lights L2 converted into collimated lights by the second collimating lenses 202 are reflected by the second reflection surfaces 222. The second reflection surfaces 222 can be considered as surfaces of the second reflection units 220 for receiving the second emission lights L2. The second reflection surfaces 222 can reflect the second emission lights L2 toward above the light emission elements 100a and 100b. The second emission lights L2 reflected by the second reflection surfaces 222 can travel upward in the vertical direction with respect to the upper surface of the active layer 106 (Z direction) as second reflection lights $L2_R$, for example. The second reflection surfaces 222 are inclined to the upper surface of the base 250 (X-Y plane), for example, and are inclined at 45 degrees in the example shown in the figures. In this arrangement, right angles are formed by each traveling direction of the second emission lights L2 and the corresponding traveling direction of the second reflection light $L2_R$. It is preferable that the reflectance of the second reflection surfaces 222 for reflecting the second emission lights L2 is higher than 50% and equal to or lower than 100%. The second reflection units 220 are made of Al, Ag, or Au, for example. The second reflection surfaces 222 of the second reflection units 220 may be produced by using these materials (such as Al, Ag, and Au) only for the material of the surfaces of the second reflection units 220, for example. The second reflection units 220 are supported by the reflection unit supporting substrate 244, for example.

The third reflection units 230 can reflect the third emission lights L3 by the third reflection surfaces 232. The third emission lights L3 converted into collimated lights by the third collimating lenses 204 are reflected by the third reflection surfaces 232. The third reflection surfaces 232 can be considered as surfaces of the third reflection units 230 for receiving the third emission lights L3. The third reflection surfaces 232 can reflect the third emission lights L3 toward above the light emission elements 100a and 100b. The third emission lights L3 reflected by the third reflection surfaces 232 can travel upward in the vertical direction with respect to the upper surface of the active layer 106 (Z direction) as third reflection lights $L3_R$, for example. The third reflection surfaces 232 are inclined to the upper surface of the base 250 (X-Y plane), for example, and are inclined at 45 degrees in the example shown in the figures. In this arrangement, right angles are formed by each traveling direction of the third emission lights L3 and the corresponding traveling direction of the third reflection light $L3_R$. It is preferable that the reflectance of the third reflection surfaces 232 for reflecting the third emission lights L3 is higher than 50% and equal to or lower than 100%. The third reflection units 230 are made of Al, Ag, or Au, for example. The third reflection surfaces 232 of the third reflection units 230 may be produced by using these materials (such as Al, Ag, and Au) only for the material of the surfaces of the third reflection units 230, for example. The third reflection units 230 are supported by the reflection unit supporting substrate 244, for example.

The fourth reflection units 240 can reflect the fourth emission lights L4 by the fourth reflection surfaces 242. The fourth emission lights L4 converted into collimated lights by the fourth collimating lenses 206 are reflected by the fourth reflection surfaces 242. The fourth reflection surfaces 242 can be considered as surfaces of the fourth reflection units 240 for receiving the fourth emission lights L4. The fourth reflection surfaces 242 can reflect the fourth emission lights L4 toward above the light emission elements 100a and 100b. The fourth emission lights L4 reflected by the fourth reflection surfaces 242 can travel upward in the vertical direction with respect to the upper surface of the active layer 106 (Z direction) as fourth reflection lights $L4_R$, for example. The fourth reflection surfaces 242 are inclined to the upper surface of the base 250 (X-Y plane), for example, and are inclined at 45 degrees in the example shown in the figures. In this arrangement, right angles are formed by each traveling direction of the fourth emission lights L4 and the corresponding traveling direction of the fourth reflection light $L4_R$. It is preferable that the reflectance of the fourth reflection surfaces 242 for reflecting the fourth emission lights L4 is higher than 50% and equal to or lower than 100%. The fourth reflection units 240 are made of Al, Ag, or Au, for example. The fourth reflection surfaces 242 of the fourth reflection units 240 may be produced by using these materials (such as Al, Ag, and Au) only for the material of the surfaces of the fourth reflection units 240, for example. The fourth reflection units 240 are supported by the reflection unit supporting substrate 244, for example.

As illustrated in FIG. 3, the first emission surfaces 162a and the third emission surfaces 162b included in the light emitting device 1000 are disposed in such positions as to be shifted from one another in the direction where the light emission elements 100a and 100b are laminated (Z direction) on the first plane. Thus, as illustrated in FIG. 1, the first reflection surfaces 212 and the third reflection surfaces 232 can be disposed such that each optical path length D1 of the first emission lights L1 between the first emission surfaces 162a and the first reflection surfaces 212 becomes equal to each optical path length D3 of the third emission lights L3 between the third emission surfaces 162b and the third reflection surfaces 232. Similarly, the second emission surfaces 164a and the fourth emission surfaces 164b are disposed in such positions as to be shifted from one another in the direction where the light emission elements 100a and 100b are laminated (Z direction) on the second plane. Thus, the second reflection surfaces 222 and the fourth reflection surfaces 242 can be disposed such that each optical path length D2 of the second emission lights L2 between the second emission surfaces 164a and the second reflection surfaces 222 becomes equal to each optical path length D4 of the fourth emission lights L4 between the fourth emission surfaces 164b and the fourth reflection surfaces 242. In the example shown in the figures, the optical path length D1 of the first emission light L1, the optical path length D2 of the second emission light L2, the optical path length D3 of the third emission light L3, and the optical path length D4 of the fourth emission light L4 have the same length.

Right angles are formed by each traveling direction of the first emission lights L1 and a line along which the plane parallel with the upper surface of the active layer 106 (X-Y plane) and the corresponding first reflection surface 212 cross. Right angles are formed by each traveling direction of the second emission lights L2 and a line along which the plane parallel with the upper surface of the active layer 106 (X-Y plane) and the corresponding second reflection surface 222 cross. Similarly, right angles are formed by each traveling direction of the third emission lights L3 and a line along which the plane parallel with the upper surface of the active layer 106 (X-Y plane) and the corresponding third reflection surface 232 cross. Right angles are formed by each traveling direction of the fourth emission lights L4 and a line along which the plane parallel with the upper surface of the active layer 106 (X-Y plane) and the corresponding fourth reflection surface 242 cross. In this arrangement, each traveling direction of the first reflection lights $L1_R$ reflected by the first reflection surfaces 212, each traveling direction of the second reflection lights $L2_R$ reflected by the second reflection surfaces 222, each traveling direction of the third reflection lights $L3_R$ reflected by the third reflection surfaces 232, and each traveling direction of the fourth reflection lights $L4_R$ reflected by the fourth reflection surfaces 242 can be equalized.

The reflection unit supporting substrates 244 are components for supporting the reflection units 210, 220, 230, and 240. In the example shown in the figures, the two reflection unit supporting substrates 244 are equipped, one of which supports the first reflection units 210 and the third reflection units 230, and the other of which supports the second reflection units 220 and the fourth reflection units 240. The shapes of the reflection unit supporting substrates 244 are not specifically limited as long as they can support the reflection units 210, 220, 230, and 240. The reflection unit supporting substrates 244 are made of glass, ceramics or the like.

The base 250 can support the light emission elements 100a and 100b indirectly by using the first sub mount 260a and the second sub mount 260b. The base 250 is constituted by a plate-shaped (rectangular parallelepiped) component, for example. The base 250 may have pillars 252, for example. The pillars 252 contact the sub mounts 260a, 260b, and 260c, for example, and release heat from the sub mounts 260a, 260b, and 260c. The base 250 is made of Cu, Al, Mo, W, Si, C, Be, or Au, or compounds (such as AlN and BeO) or alloys (such as CuMo) of these materials, for example. Alternatively, the base 250 may be constituted by a combination of these examples such as a multilayer structure containing copper (Cu) layers and molybdenum (Mo) layers.

The first sub mount 260a can support the first light emission element 100a. The second sub mount 260b can support the second light emission element 100b. The third sub mount 260c formed on the second light emission element 100b can support the lead 270. Each of the sub mounts 260a, 260b, and 260c is constituted by AlN, CuW, SiC, BeO, CuMo, a multilayer constitution (CMC) containing copper (Cu) layers and molybdenum (Mo) layers, and the like, for example.

The thermal conductivity of the base 250 is higher than the thermal conductivities of the sub mounts 260a, 260b, and 260c, and the thermal conductivities of the sub mounts 260a, 260n, and 260c are higher than the thermal conductivities of the light emission elements 100a and 100b. The respective thermal conductivities of the base 250 and the sub mounts 260a, 260b, and 260c are at least 140 W/mK, for example. It is preferable that thermal expansion coefficients of the sub mounts 260a, 260b, 260c are close to the thermal expansion coefficients of the light emission elements 100a and 100b. When the light emission elements 100a and 100b are directly mounted on the base 250 without using the sub mounts 260a, 260b, or 260c (this condition is not shown in the figures), for example, the light emission elements 100a and 100b warp by the excessive heat generated while the light emission elements 100a and 100b are mounted or the heat generated while the light emission elements 100a and 100b are driven due to the difference of the thermal expansion coefficients between the base 250 and the light emission elements 100a and 100b. In this case, there is a possibility that stresses applied to the light emission elements 100a and 100b lower the reliability. For overcoming this problem, this embodiment uses the sub mounts 260a, 260b, and 260c to reduce the stresses produced by the difference of the thermal expansion coefficients between the base 250 and the light emission elements 100a and 100b and thus increase the reliability. Moreover, the degree of heat release can be further raised by the contact provided between the pillars 252 and the respective sub mounts 260a, 260b, and 260c. That is, the pillars 252 function as the heat release units for releasing heat from the sub mounts 260a, 260b, and 260c. In this case, electrical short-circuiting can be prevented by providing insulation material at least on the surfaces of the pillars 252 contacting the sub mounts 260a, 260b, and 260c, for example.

The lead 270 is disposed on the third sub mount 260c. The lead 270 electrically connects a terminal 272 and the third sub mount 260c. According to the light emitting device 1000, the base 250 functions as anode terminal, and the terminal 272 functions as cathode terminal, for example. As illustrated in FIG. 3, the terminal 272 is supported by a terminal supporting unit 274 formed on the base 250.

While the structure in which the light emission elements 100a and 100b are made of InGaAlP system material has been discussed as an example of the light emitting device 1000 in this embodiment, the light emission elements 100a and 100b may be constituted by various types of materials as long as the light emission gain areas can be formed. For example, in case of semiconductor materials, the light emission elements 100a and 100b may be AlGaN system, InGaN system, GaAs system, InGaAs system, GaInNAs system, and ZnCdSe system or other semiconductor materials.

The light emitting device 1000 has the following characteristics.

According to the light emitting device 1000, each of the first reflection surfaces 212 and the third reflection surfaces 232 can be disposed such that the optical path length D1 of the first emission light L1 between the first emission surface 162a and the first reflection surface 212 becomes equal to the optical path length D3 of the third emission light L3 between the third emission surface 162b and the third reflection surface 232. Similarly, each of the second reflection surfaces 222 and the fourth reflection surfaces 242 can be disposed such that the optical path length D2 of the second emission light L2 between the second emission surface 164a and the second reflection surface 222 becomes equal to the optical path length D4 of the fourth emission light L4 between the fourth emission surface 164b and the fourth reflection surface 242. Thus, the output of the light emitting device 1000 can be raised without increasing the size of the device in the traveling directions of the emission lights L1, L2, L3, and L4. For example, in case of a light emitting device which includes the emission surfaces disposed in lines in the direction where the light emission elements are laminated, the respective reflection surfaces need to be provided at positions steppedly shifted from one another with respect to the traveling directions of the emission lights. In this case, the device becomes large-sized in the traveling directions of the emission lights. In this embodiment, however, this problem can be avoided. Accordingly, high output and size reduction can be achieved.

According to the light emitting device 1000, the emission lights L1, L2, L3, and L4 can be reflected in the same direction. That is, the traveling directions of the first reflection lights $L1_R$ reflected by the first reflection surfaces 212, the second reflection lights $L2_R$ reflected by the second reflection surfaces 222, the third reflection lights $L3_R$ reflected by the third reflection surfaces 232, and the fourth reflection lights $L4_R$ reflected by the fourth reflection surfaces 242 can be equalized. In this case, the structure of the optical system of a projector can be simplified when the light emitting device is used as the light source of the projector, for example. Accordingly, the optical axis adjustment of the projector can be easily carried out.

The light emitting device 1000 may include the collimating lenses 200, 202, 204, and 206. In this case, the emission lights L1, L2, L3, and L4 can be converted into collimated lights and supplied to the reflection surfaces 212, 222, 232, and 242. Accordingly, the efficiency of using light can improve.

According to the light emitting device 1000, the light emission elements 100a and 100b may be constituted by SLDs. In this case, laser generation of light produced within the gain areas 160 can be reduced or prevented. Accordingly, speckle noise can be decreased.

2. Light Emitting Device Manufacturing Method

Figure 5:
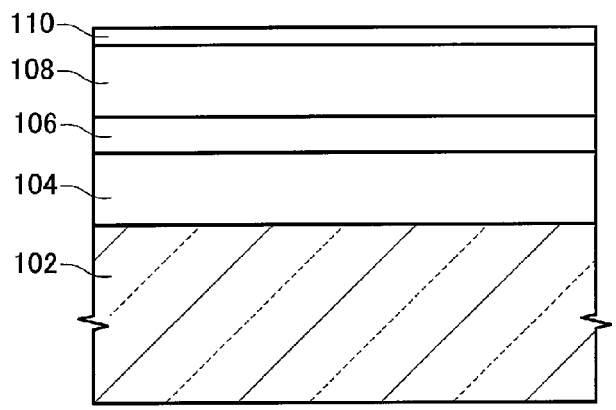
FIG. 5 is a cross-sectional view schematically illustrating a manufacturing step of the light emitting device according to the embodiment.
Figure 6:
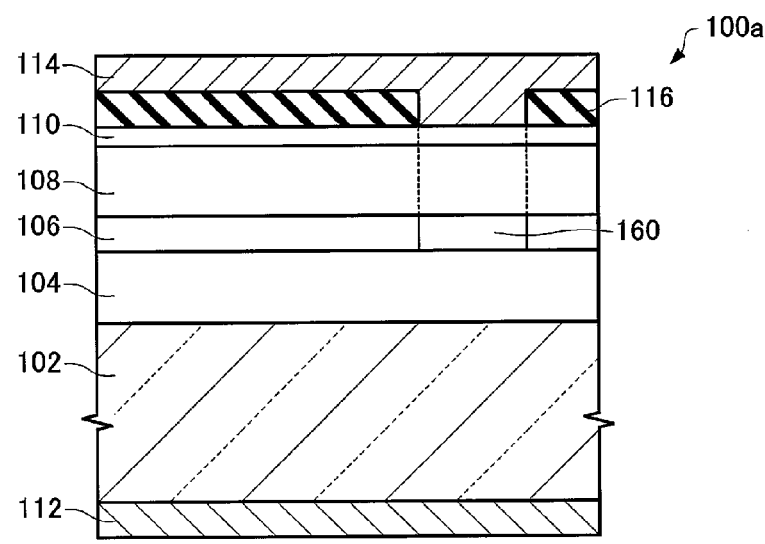
FIG. 6 is a cross-sectional view schematically illustrating a manufacturing step of the light emitting device according to the embodiment.

A method of manufacturing the light emitting device 1000 according to this embodiment is now described with reference to the drawings. FIGS. 5 and 6 are cross-sectional views schematically illustrating the steps for manufacturing the light emitting device 1000.

As illustrated in FIG. 5, the first clad layer 104, the active layer 106, the second clad layer 108, and the contact layer 110 are formed on the substrate 102 in this order by epitaxial growth. For epitaxial growth, MOCVD (metal organic chemical vapor deposition) method, MBE (molecular beam epitaxy) method, or other methods may be used.

As illustrated in FIG. 6, the insulation portion 116 having the opening is formed on the contact layer 110. The insulation portion 116 is formed by CVD (chemical vapor deposition) method or other methods. The opening is formed by patterning using a photolithography technique and an etching technique such that the contact layer 110 can be exposed through the opening.

Then, the second electrode 114 is formed on the exposed contact layer 110 and the insulation portion 116. Subsequently, the first electrode 112 is formed beneath the lower surface of the substrate 102. The first electrode 112 and the second electrode 114 are formed by vacuum deposition method, for example. The forming order of the first electrode 112 and the second electrode 114 is not specifically limited. By these steps, the first light emission element 100a can be produced.

As illustrated in FIG. 2, the first sub mount 260a, the first light emission element 100a, the second sub mount 260b, the second light emission element 100b, and the third sub mount 260c are initially mounted in this order on the base 250.

As illustrated in FIGS. 1 and 3, the terminal 272 is formed. The terminal 272 is disposed on the terminal supporting unit 274 provided on the base 250. Then, the terminal 272 and the third sub mount 260c are connected by the lead 270.

Next, the collimating lenses 200, 202, 204, and 206 and the reflection units 210, 220, 230, and 240 are disposed on the base 250. The collimating lenses 200, 202, 204, and 206 and the reflection units 210, 220, 230, and 240 are positioned while the optical axes of these components are adjusted to the emission lights L1, L2, L3, and L4.

By these steps, the light emitting device 1000 can be manufactured.

3. Modified Examples of Light Emitting Device

Light emitting devices according to modified examples of this embodiment are now described with reference to the drawings. In the light emitting devices according to the modified examples of this embodiment, the same reference numbers are given to parts having functions similar to those of the components included in the light emitting device 1000 in this embodiment, and the detailed explanation of those is not repeated.

(1) Light Emitting Device in First Modified Example

Figure 7:
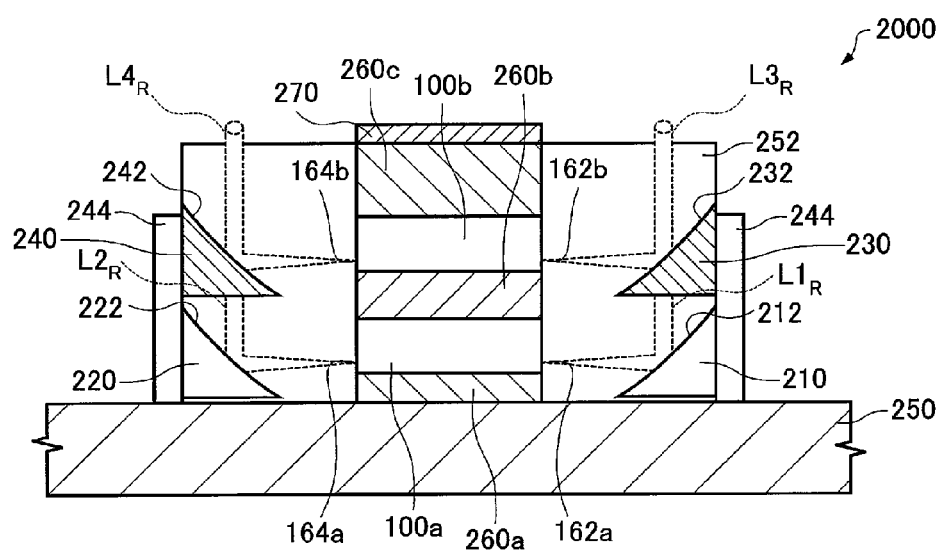
FIG. 7 is a cross-sectional view schematically illustrating a light emitting device according to a first modified example of the embodiment.

A light emitting device 2000 according to a first modified example of this embodiment is initially explained with reference to the drawings. FIG. 7 is a cross-sectional view schematically illustrating the light emitting device 2000 as a figure corresponding to FIG. 2. In FIG. 7, the simplified light emission elements 100a and 100b are shown for convenience.

According to the example of the light emitting device 1000, the reflection surfaces 212, 222, 232, and 242 are surfaces inclined to the surface of the base 250 at 45 degrees as shown in FIG. 2. In case of the light emitting device 2000, however, the reflection surfaces 212, 222, 232, and 242 may be parabolic mirrors as illustrated in FIG. 7. That is, the reflection surfaces 212, 222, 232, and 242 may have paraboloidal shapes (shapes of paraboloid of revolution).

The first emission surface 162a of the first emission element 100a is positioned at the focus of the first reflection surface 212, and the second emission surface 164a of the first light emission element 100a is positioned at the focus of the second reflection surface 222, for example. In this arrangement, the two emission lights L1 and L2 emitted from the first light emission element 100a in the horizontal direction can be reflected in the same direction, and can be converted into collimated lights. Similarly, the third emission surface 162b of the second emission element 100b is positioned at the focus of the third reflection surface 232, and the fourth emission surface 164b of the second light emission element 100b is positioned at the focus of the fourth reflection surface 242, for example. In this arrangement, the two emission lights L3 and L4 emitted from the second light emission element 100b in the horizontal direction can be reflected in the same direction, and can be converted into collimated lights.

According to the light emitting device 2000, therefore, the emission lights L1 and L2 can be converted into collimated lights by the function of the reflection surfaces 212, 222, 232, and 242 without using the collimating lenses 200, 202, 204, and 206. Thus, the number of the components can be reduced.

(2) Light Emitting Device in Second Modified Example

Figure 8:
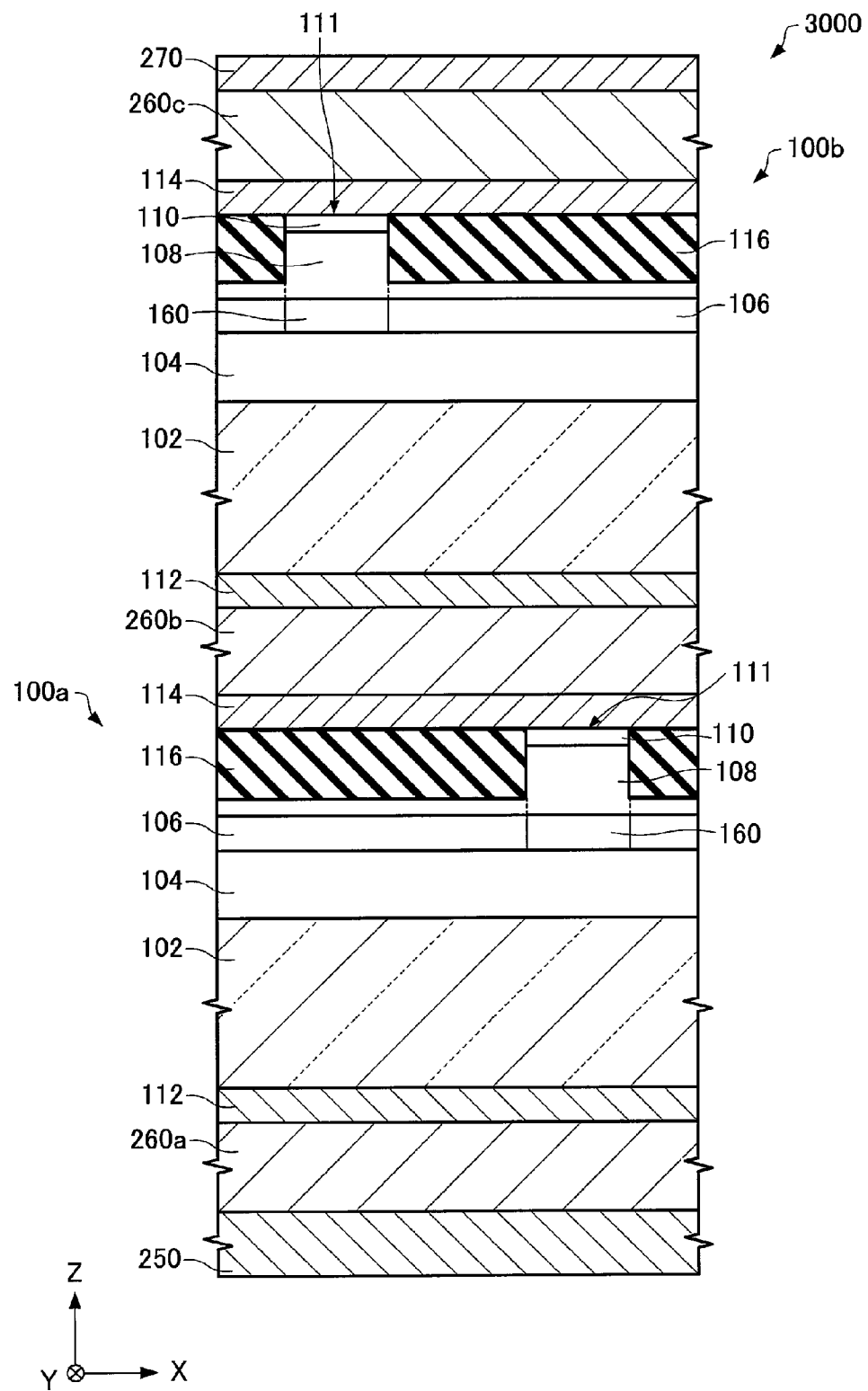
FIG. 8 is a cross-sectional view schematically illustrating a light emitting device according to a second modified example of the embodiment.

A light emitting device 3000 according to a second modified example of this embodiment is now described with reference to the drawings. FIG. 8 is a cross-sectional view schematically illustrating the light emitting device 3000 as a figure corresponding to FIG. 4.

While the example of the light emitting device 1000 is of so-called gain waveguide type, the light emitting device 3000 may be of so-called refractive index waveguide type.

More specifically, a part of the contact layer 110 and the second clad layer 108 of the light emitting device 3000 may constitute a pillar-shaped portion 111 as illustrated in FIG. 8. The plane shape of the pillar-shaped portion 111 is the same as the shape of the gain area 160. For example, the plane shape of the pillar-shaped portion 111 determines the current path between the electrodes 112 and 114, and thus determines the plane shape of the gain area 160. Though not shown in figures, the pillar-shaped portion 111 may be constituted by the contact layer 110, the second clad layer 108, and the active layer 106, or may be constituted by these layers and further the first clad layer 104, for example. In addition, the side surface of the pillar-shaped portion 111 may be inclined.

The insulation portion 116 is provided on the side of the pillar-shaped portion 111. The insulation portion 116 may contact the side surface of the pillar-shaped portion 111. Current flowing between the electrodes 112 and 114 may flow in the pillar-shaped portion 111 surrounded by the insulation portion 116 while avoiding the insulation portion 116. The refractive index of the insulation portion 116 may be smaller than the refractive index of the active layer 106. In this case, light can be efficiently closed within the gain area 160 in the plane direction (direction parallel with the upper surface of the active layer 106).

4. Projector

Figure 9:
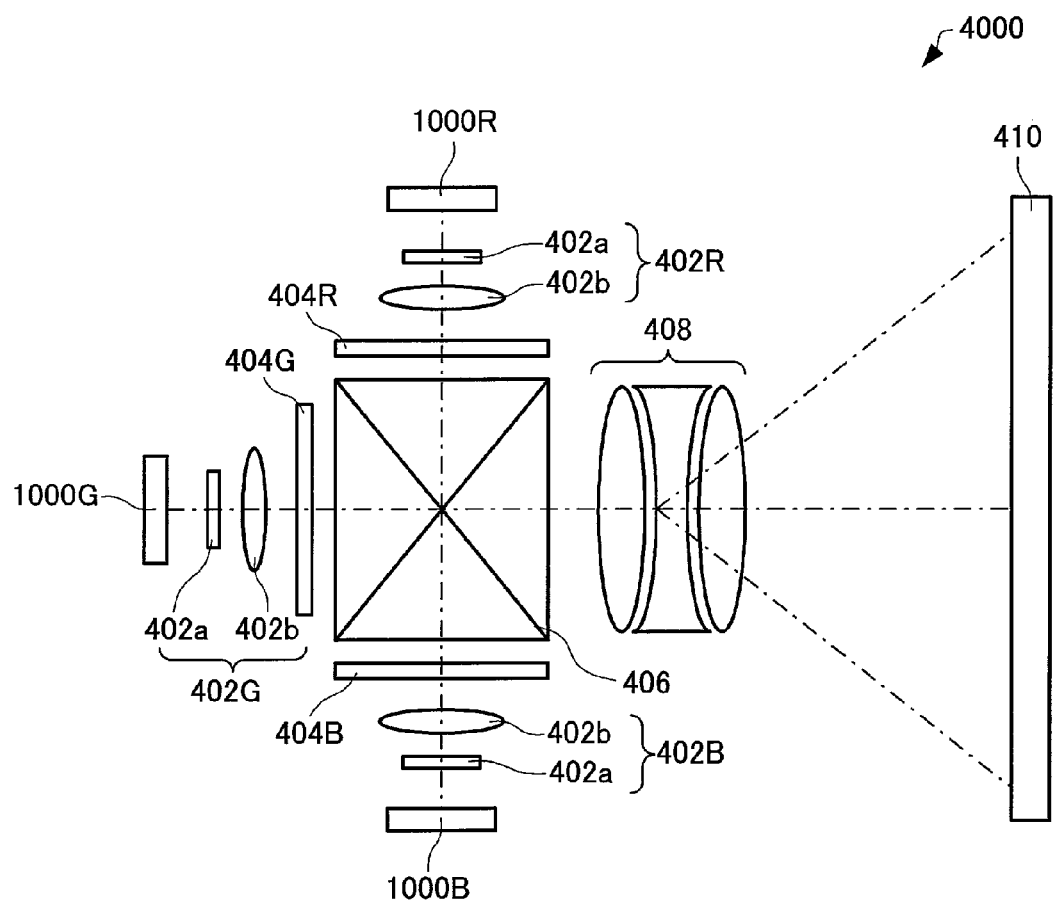
FIG. 9 schematically illustrates a projector according to the embodiment.

A projector 4000 according to this embodiment is now described with reference to the drawings. FIG. 9 schematically illustrates the projector 4000. FIG. 9 does not show a housing of the projector 4000 for convenience.

Each of a red light source (light emitting device) 1000R for emitting red light, a green light source (light emitting device) 1000G for emitting green light, and a blue light source (light emitting device) 1000B for emitting blue light included in the projector 4000 corresponds to the light emitting device (such as the light emitting device 1000) according to an embodiment of the invention.

The projector 4000 may include transmission type liquid crystal light valves (light modulation devices) 404R, 404G, and 404B for modulating lights emitted from the light sources 1000R, 1000G, and 1000B, respectively, according to image information, and a projection lens (projection device) 408 for expanding an image formed by the liquid crystal light valves 404R, 404G, and 404B and projecting the expanded image on a screen (display surface) 410. The projector 4000 may further include a cross dichroic prism (color light combining unit) 406 for combining lights received from the liquid crystal light valves 404R, 404G, and 404B and guiding the combined light to the projection lens 408.

The projector further contains equalizing systems 402R, 402G, and 402B disposed on the optical path downstream from the respective light sources 1000R, 1000G, and 1000B for equalizing illuminance distributions of lights emitted from the light sources 1000R, 1000G, and 1000B. The lights having the illuminance distributions equalized by the equalizing systems 402R, 402G, and 402B are applied to the liquid crystal light valves 404R, 404G, and 404B. Each of the equalizing systems 402R, 402G, and 402B includes a hologram 402a and a field lens 402b, for example.

The three color lights modulated by the respective liquid crystal light valves 404R, 404G, and 404B enter the cross dichroic prism 406. This prism is produced by affixing four rectangular prisms, and has a dielectric multilayer film for reflecting red light and a dielectric multilayer film for reflecting blue light disposed in a cross shape on the inner surfaces of the prisms. The three color lights are combined by these dielectric multilayer films to form light representing a color image. Then, the combined light is projected on the screen 410 by using the projection lens 406 as the projection system for display of the expanded image.

As described above, the projector 4000 can use the high-output and compact light emitting devices 1000 as the light source. Thus, the projector 4000 becomes a high-output and compact projector.

While the transmission-type liquid crystal light valves are used as the light modulation devices, the light modulation devices may be light valves of types other than the liquid crystal type or reflection-type light valves. Examples of these light valves involve reflection-type liquid crystal light valves and digital micromirror devices. The structure of the projection system is changed according to the types of light valves to be used.

The light emitting device 1000 may be applied to a light source device of a scanning-type image display apparatus (projector) having a scanning unit as an image forming device for displaying an image of a desired size on a display surface by applying light emitted from the light emitting device 1000 on a screen for scanning.

The invention is not limited to the embodiment and the modified examples shown herein only as examples. For example, the embodiment and the modified examples may be combined in appropriate manners.

While the embodiment according to the invention has been described in detail, it is easily understood by those skilled in the art that various modifications may be made substantially without departing from the novel matters and advantages of the invention. It is therefore intended that these modifications are all included in the scope of the invention.

The entire disclosure of Japanese Patent Application No. 2009-279197, filed Dec. 9, 2009 is expressly incorporated by reference herein.

What is claimed is:

1. A light emitting device comprising:

a first light emission element which has a first emission surface for emitting a first emission light, an a second emission surface for emitting a second emission light traveling in a direction opposite to the direction of the first emission light, and a first gain area that generates the first emission light and the second emission light and that is connected between the first emission surface and the second emission surface;

a second light emission element which has a third emission surface for emitting a third emission light traveling in the same direction as the direction of the first emission light, a fourth emission surface for emitting a fourth emission light traveling in the direction opposite to the direction of the third emission light, and a second gain area that generates the third emission light and the fourth emission light and that is connected between the third emission surface and the fourth emission surface;

a first reflection surface which reflects the first emission light emitted from the first light emission element;

a second reflection surface which reflects the second emission light emitted from the first light emission element;

a third reflection surface which reflects the third emission light emitted from the second light emission element; and a fourth reflection surface which reflects the fourth emission light emitted from the second light emission element;

wherein the first light emission element and the second light emission element are laminated in a first direction, the first emission surface and the third emission surface are located within a first plane, the second emission surface and the fourth emission surface are located within a second plane, the first emission surface and the third emission surface are disposed in such positions as to be shifted from each other in the first direction in the first plane, the second emission surface and the fourth emission surface are disposed in such positions as to be shifted from each other in the first direction in the second plane, the first gain area and the second gain area do not overlap with each other as viewed in the first direction the first reflection surface and the third reflection surface are disposed in such positions that the optical path length of the first emission light between the first emission surface and the first reflection surface becomes equal to the optical path length of the third emission light between the third emission surface and the third reflection surface, the second reflection surface and the fourth reflection surface are disposed in such positions that the optical path length of the second emission light between the second emission surface and the second reflection surface becomes equal to the optical path length of the fourth emission light between the fourth emission surface and the fourth reflection surface, and a traveling direction of the first emission light reflected by the first reflection surface, a traveling direction of the second emission light reflected by the second reflection surface, a traveling direction of the third emission light reflected by the third reflection surface, and a traveling direction of the fourth emission light reflected by the fourth reflection surface are equalized.

2. The light emitting device according to claim 1, further comprising:

a first collimating lens disposed on the optical path of the first emission light between the first emission surface and the first reflection surface to convert the first emission light into collimated light;

a second collimating lens disposed on the optical path of the second emission light between the second emission surface and the second reflection surface to convert the second emission light into collimated light;

a third collimating lens disposed on the optical path of the third emission light between the third emission surface and the third reflection surface to convert the third emission light into collimated light; and a fourth collimating lens disposed on the optical path of the fourth emission light between the fourth emission surface and the fourth reflection surface to convert the fourth emission light into collimated light.

3. The light emitting device according to claim 1, wherein the first reflection surface, the second reflection surface, the third reflection surface, and the fourth reflection surface are parabolic mirrors.

4. The light emitting device according to claim 1, wherein:

the plural first emission surfaces are disposed at equal intervals;

the plural second emission surfaces are disposed at equal intervals;

the plural third emission surfaces are disposed at equal intervals; and the plural fourth emission surfaces are disposed at equal intervals.

5. The light emitting device according to claim 1, wherein the first light emission element and the second light emission element are super luminescent diodes.

6. A light emitting device comprising:

a first light emission element which includes a first gain area, which generates a first emission light b current injection, and emits the first emission light;

a second light emission element which includes a second gain area, which generates a second emission light by current injection, and emits the second emission light;

a first reflection surface which reflects the first emission light; and a second reflection surface which reflects the second emission light, wherein the first light emission element and the second light emission element are laminated in a first direction and disposed in such positions that an emission direction of the first emission light and an emission direction of the second emission light become parallel with each other and that the firs gain area of the first light emission element and the second gain area of the second light emission element do not overlap with each other as viewed in the first direction, and a traveling direction of the first emission light reflected by the first reflection surface and a traveling direction of the second emission light reflected by the second reflection surface become parallel with each other.

7. A projector comprising:

the light emitting device according to claim 1;

a light modulation device which modulates light emitted from the light emitting device according to image information; and a projection device which projects an image formed by the light modulation device.

* * * * *